United States Patent [19]

Hoffman

[11] Patent Number: 4,460,985
[45] Date of Patent: Jul. 17, 1984

[54] SENSE AMPLIFIER FOR MOS STATIC MEMORY ARRAY

[75] Inventor: Charles R. Hoffman, Raleigh, N.C.

[73] Assignee: International Business Machines Corporation, Armonk, N.Y.

[21] Appl. No.: 350,504

[22] Filed: Feb. 19, 1982

[51] Int. Cl.³ .................................................. G11C 7/00
[52] U.S. Cl. ..................................... 365/207; 307/530
[58] Field of Search ............... 365/205, 206, 207, 208, 365/210; 307/530, DIG. 3

[56] References Cited

U.S. PATENT DOCUMENTS 4,162,416  7/1979  Beecham et al. ............... 365/208 X
4,397,003  8/1983  Wilson et al. ....................... 365/205

OTHER PUBLICATIONS

IBM J. Res. Develop., vol. 24, No. 3, May 1980, K. Gray, "Cross-Coupled Charge-Transfer Sense Amplifier and Latch Sense . . .".
IEEE Journal of Solid-State Circuits, vol. SC-15, No. 3, Jun. 1980, T. Hagiwara et al, "A 16 kbit Electrically Erasable PROM . . .".
IEEE Journal of Solid-State Circuits, vol. SC-15, No. 3, Jun. 1980, B. Giebel, "An iK EEPROM Using the SIMOS Storage Cell".
IEEE Jour. of Solid-State Cir., vol. SC-12, No. 5, Oct. 1977, R. Muller et al, "An 8192-bit Electrically Alterable ROM . . .".
IEEE Trans. on Elec. Devices, vol. ED-28, No. 9, Sep. 1981, D. KiMaria et al, "Dual-Electron-Injector-Structure Electrically . . .".

Primary Examiner—Joseph A. Popek
Attorney, Agent, or Firm—Edward H. Duffield

[57] ABSTRACT

A bit line sense amplifier circuit for an Electrically Alterable Read Only Memory. A reference voltage is produced which tracks a power supply voltage, remaining a threshold voltage away therefrom at all times. The reference voltage is fed to one input terminal of a differential amplifier comparator, the other input terminal of which is connected to the bit line. A voltage clamping circuit is also provided on the bit line which prevents excursions of the bit line voltage to a point just below that at which the switch point occurs. A pull-up circuit, which pulls the bit line toward the power supply voltage, supplies an increasing drive capability as the bit line voltage moves toward the switching point and a lesser drive capacity thereafter to prevent excessive excursions of the bit line voltage. A buffer level shifting output circuit converts the output of the differential amplifier to logic levels.

13 Claims, 5 Drawing Figures $$I_C = \begin{array}{c} I_{C1} \text{ FOR DATA "1"} \\ 0 \text{ FOR DATA "0"} \\ \hline \text{SELECTED CELL} \end{array} \qquad = \qquad \frac{0}{\text{UNSELECTED CELL}}$$

SENSE AMPLIFIER FOR MOS STATIC MEMORY ARRAY

BACKGROUND OF THE INVENTION

The invention pertains generally to sense amplifiers used to determine the state of data stored in memory cells in an MOS memory array. More specifically, the invention pertains to a sense amplifier which is particularly adapted for use in an EAROS (Electrically Alterable Read Only Storage) device.

There are presently available basically two types of MOS memories, a dynamic type and a static type. The static type is preferred in applications where ease of operation, design and process control are of primary importance. This is due to the fact that a static type MOS memory does not require periodic refreshing as does the dynamic type. On the other hand, the dynamic type is advantageous in applications requiring low power dissipation, high speeds, and high memory densities.

An example of an EAROS memory is disclosed in "Dual-Electron-Injector-Structure Electrically Alterable Read-Only-Memory Modelling Studies", DiMaria et al., *IEEE Transactions on Electron Devices*, Vol. ED-28, No. 9, September 1981, pp. 1047–1053. In memories of this type, it is required that a relatively small current on the bit lines be detected. The detection function is complicated by the fact that each bit line is shunted by a relatively large capacitance due to the fact that many memory cells share a single bit line.

FIG. 1 is a schematic diagram showing a circuit model of a cell and bit line in a memory of this type. The cell portion of the circuit is a current source 21 through which flows a current $I_C$ having a fixed value of $I_{C1}$ for a logic or data value of 1 and zero for a data 0 for a selected cell, and a current value of zero for all unselected cells. The current source 21 is shunted by a bit line capacitance 22 having a capacitance value of $C_{BL}$. The voltage $V_{BL}$ indicated in FIG. 1 is the voltage which appears on the bit line as seen by the sense amplifier.

The magnitude of the current $I_{C1}$ is rather low in an EAROS device because the EAROS cells each include two transistors in series. The series connection of the two transistors in the cell is connected to the bit line, when the cell is selected, through a column select (Y-select) switch, which itself is a transistor. The series connection of the three transistors forces each of the transistors to be operated in the linear region of its drain voltage—current characteristic. In the linear region, the drain current varies proportionally to the drain voltage. Thus, the current $I_{CL}$ increases as the voltage $V_{BL}$ increases.

Prior art sense amplifier designs have ranged in complexity from a single transistor in which a data signal input either turns the transistor on or off to very complex clock amplifiers. An example of the latter type is discussed in "Cross-Coupled Charge-Transfer Sense Amplifier and Latch Sense Scheme for High-Density FET Memories", K. S. Gray, *IBM J. Res. Develop.*, May, 1980, pp. 283–290.

In another sense amplifier, specifically intended for use with an EAROS device, disclosed in "An 8192-Bit Electrically Alterable ROM Employing A One-Transistor Cell with Floating Gate", Muller et al., *IEEE J. Solid-State Circuits* October 1977, pp. 507–514, a Schmitt trigger circuit is utilized. This circuit suffers from a number of drawbacks in that the cell current is very low due to a relatively low bit line voltage and a very wide bit line voltage excursion window. This results in the memory device having less than optimum speed.

Yet another sense amplifier is disclosed in "An 8K EEPROM Using the SIMOS Storage Cell", B. Giebel, *IEEE J. Solid-State Circuits,* June 1980, pp. 311–315, specifically, in FIG. 6 thereof. This sense amplifier too suffers from drawbacks in that the cell voltage does not track the power supply voltage; and the threshold voltage, which determines whether a data 0 or data 1 is stored in the cell, is nearer to ground level than to the power supply voltage level. Accordingly, the cell voltage is not optimized to provide a maximum cell current, again slowing the operation of the memory. Moreover, the sense amplifier circuitry requires a separate circuit to translate its output voltage to logic levels.

Yet another example of a prior art sense amplifier of the same general type to which the invention pertains is shown in FIG. 10 of "A 16Kbit Electrically Eraseable PROM Using N-channel Si-Gate MNOS Technology", Hagiwara et al., *IEEE J. Solid-State Circuits,* June 1980, pp. 346–353. This sense amplifier, which includes a voltage translator, operates with a fixed reference voltage which does not track the power supply voltage. Also, the threshold voltage window is quite wide, thereby causing the memory to suffer from the same drawbacks as in the other prior art arrangements discussed above. In this sense amplifier, a voltage translator circuit is included which is in fact intended to compensate for changes in the power supply voltage. However, changes in the enhancement or depletion threshold voltages of the various transistors in the circuit are not compensated. Due to the circuit arrangement utilized, changes in the enhancement of depletion threshold voltages of the series-connected devices are additive, thereby offsetting any advantage attained in voltage translation.

Accordingly, it is an object of the present invention to provide a sense amplifier for an EAROS device in which the time required to sense the data state of a storage cell is reduced.

It is a further object of the invention to provide such a sense amplifier in which power supply voltage variations do not affect the speed of the cell or disturb the accuracy of the comparison operation of the amplifier.

It is a yet further object of the invention to provide such a sense amplifier in which the bit line voltage excursion window is narrow and the bit line voltage is optimized to provide for an increased cell current.

SUMMARY OF THE INVENTION

These, as well as other objects of the invention, are met by a sense amplifier including a comparison circuit having one input coupled to a corresponding bit line and a source of a reference voltage is coupled to the other input of the comparison circuit. The reference voltage is produced by a circuit which maintains the reference voltage at a fixed voltage below the power supply voltage. A voltage clamping circuit is also connected to the bit line which prevents negative excursions of the bit line voltage beyond that necessary to correctly sense the state of the cell being sensed. Establishment of the reference voltage in this manner allows a large positive voltage to be applied to the cell being sensed, thereby maximizing the magnitude of the cell current, and hence the speed at which the data state of the cell can be correctly determined. A pull-up circuit is also provided which drives the bit line voltage back toward the switching point with increasing drive capacity as the bit line voltage moves away from the switching point.

An output circuit is provided which translates the output signal from the comparison circuit to a logic level acceptable for driving external circuitry.

DESCRIPTION OF THE PREFERRED EMBODIMENTS

Figure 1:
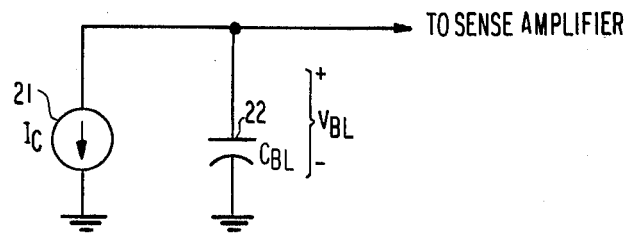
FIG. 1 is a schematic representation of a circuit model of a bit line in an EAROS device with which the invention is used to advantage.
Figure 2:
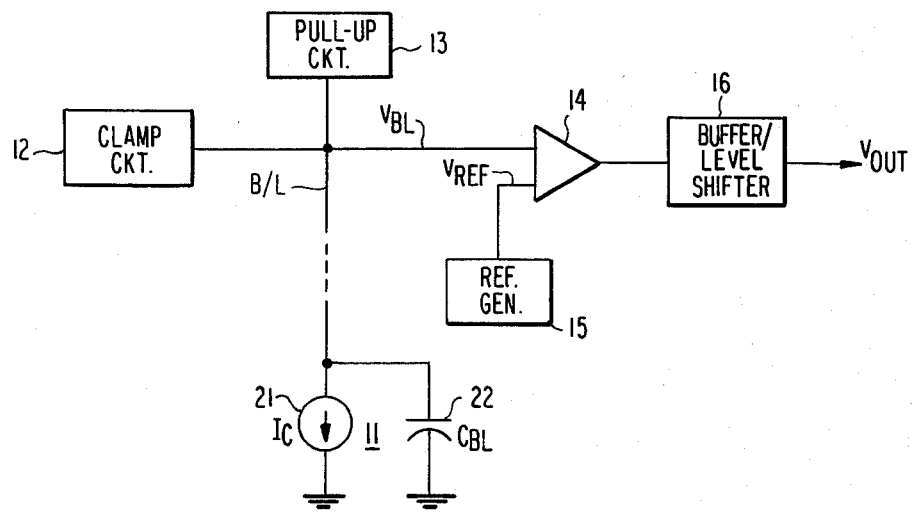
FIG. 2 is a block diagram of a sense amplifier of the type to which the invention pertains.

A sense amplifier of the invention is first shown in block diagram form in FIG. 2. As shown in FIG. 1 and as discussed above, the bit line B/L can be represented electrically by a current source 21 which outputs a current of $I_{C1}$ for a data 1 and a zero current for a data 0. The current source 21 is shunted by a capacitance 22 of value $C_{BL}$, which represents the distributed capacitance of the bit line B/L. Of course, in a practical embodiment, a larger number of bit lines and sense amplifiers would be provided, a single bit line and sense amplifier being shown in FIG. 2 for purposes of clarity.

The bit line B/L is connected directly to one input of a comparison circuit 14, to the other input of which is supplied a reference voltage $V_{REF}$ from a reference generator 15. The reference voltage $V_{REF}$ is produced in such a manner that it always remains a fixed voltage $V_x$ below a power supply voltage $V_{DD}$. This will be explained in more detail below.

A clamp circuit 12 is also connected to the bit line B/L, the purpose of which is to prevent the voltage excursions of the bit line voltage $V_{BL}$ from greatly exceeding the minimum excursion necessary to determine the correct state of the cell being sensed. Also connected to the bit line B/L is a pull-up circuit 13. The purpose of the circuit 13 is to provide an optimum voltage on the bit line B/L and to provide an increasingly strong drive capability to pull the bit line voltage in the positive direction once the bit line voltage $V_{BL}$ falls below the reference voltage $V_{REF}$ during a negative excursion.

Figure 3:
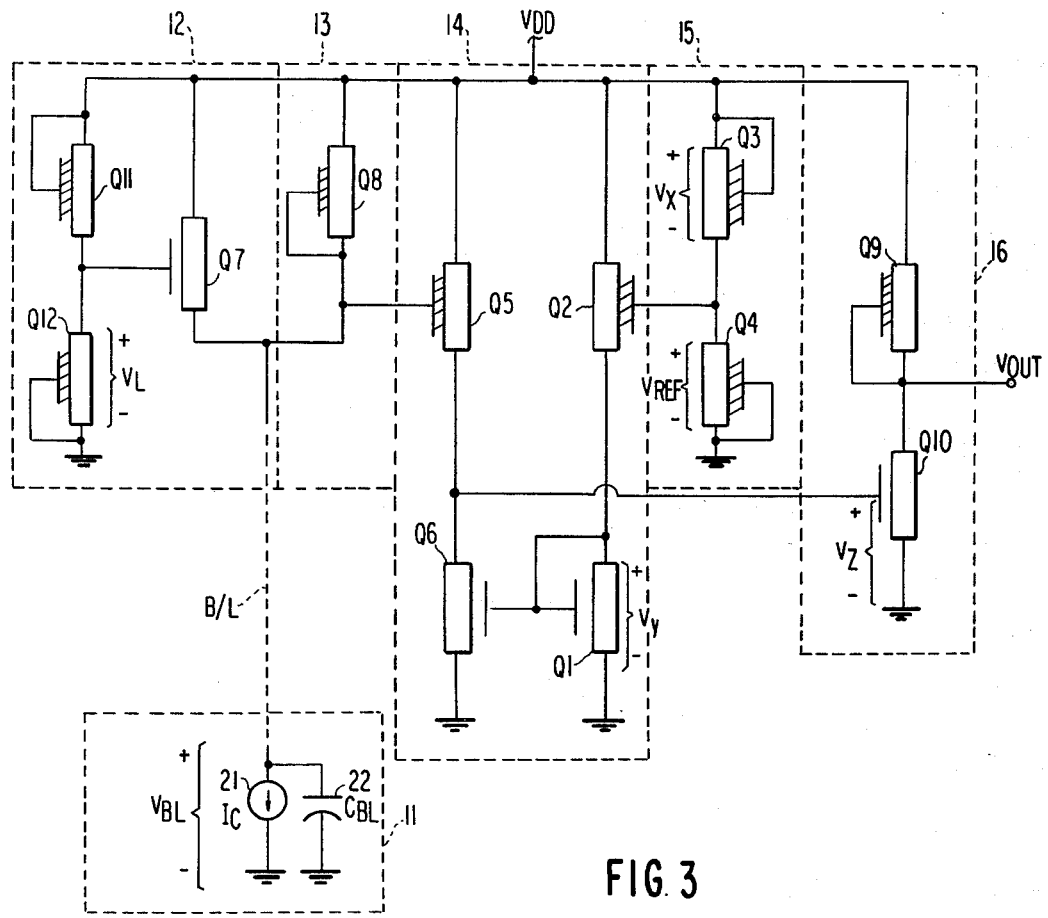
FIG. 3 is a schematic diagram of a sense amplifier constructed in accordance with the teachings of the invention.

The circuit shown in block diagram form in FIG. 2 will now be explained in more detail with reference to the circuit diagram of FIG. 3. As shown in FIG. 3, the clamp circuit 12 is implemented with three MOS FET devices, an enhancement mode device Q7 and depletion mode devices Q11 and Q12. The drain of the device Q7 is connected to a positive voltage source at voltage $V_{DD}$, as are the drain and gate of the device Q11. The source of the device Q11, the gate of the device Q7 and the drain of the device Q12 are interconnected. The source and gate of the device Q12 are connected to ground. The output of the clamp circuit 12 at the source of the device Q7 is connected directly to the bit line B/L.

The pull-up circuit 13 is implemented with a single depletion mode device Q8, the gate and source of which are connected directly to the bit line B/L and the drain of which is connected directly to the source of the voltage $V_{DD}$.

The comparison circuit 14 is composed of four devices, enhancement mode MOS FET devices Q1 and Q6 and depletion mode devices Q2 and Q5 connected in a differential amplifier configuration. The drains of the devices Q2 and Q5 are connected to the source of the voltage $V_{DD}$, the gate of the device Q5 is connected to the bit line B/L, the source of the device Q5 and the drain of the device Q6 are interconnected, as are the source of the device Q2 and the drain of the device Q1. The sources of the devices Q1 and Q6 are grounded and the gates of the devices Q1 and Q6 connected to each other and to the drain of the device Q1. The output of the comparison circuit 14 is formed on the drain of the device Q6.

The reference generator 15 is formed with two depletion mode devices Q3 and Q4. The gate and drain of the device Q3 are connected to the source of the voltage $V_{DD}$. The source of the device Q3 is connected to the gate of the device Q2 of the comparison circuit 14 and to the drain of the device Q4. The gate and source of the device Q4 are grounded. The reference voltage $V_{REF}$ is generated across the drain-source of the device Q4, with the reference polarity of this voltage being indicated in FIG. 3.

The buffer/level shifter output circuit 16 is implemented with a depletion mode device Q9 and an enhancement mode device Q10. The devices Q9 and Q10 are connected in series, with the drain of the device Q9 connected to the source of the voltage $V_{DD}$ and the drain of the device Q10 grounded. The gate of the device Q10 is connected to the output of the comparison circuit 14 on the drain of the device Q6. The output signal $V_{OUT}$ from the amplifier is provided at the interconnected gate and source of the device Q9 and drain of the device Q10.

Figure 4:
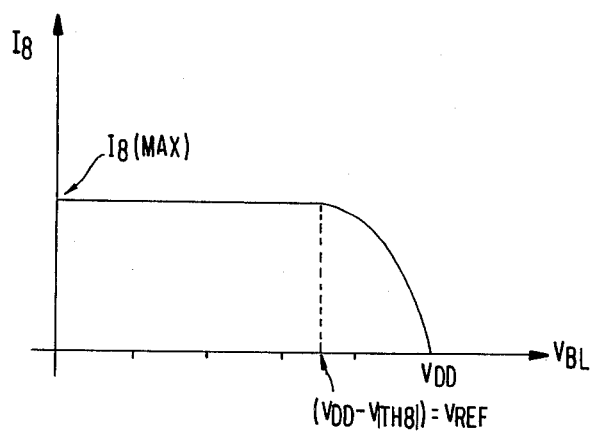
FIG. 4 is a graph indicating the current-voltage characteristics of a pull-up transistor circuit utilized in the sense amplifier of FIG. 2.
Figure 5:
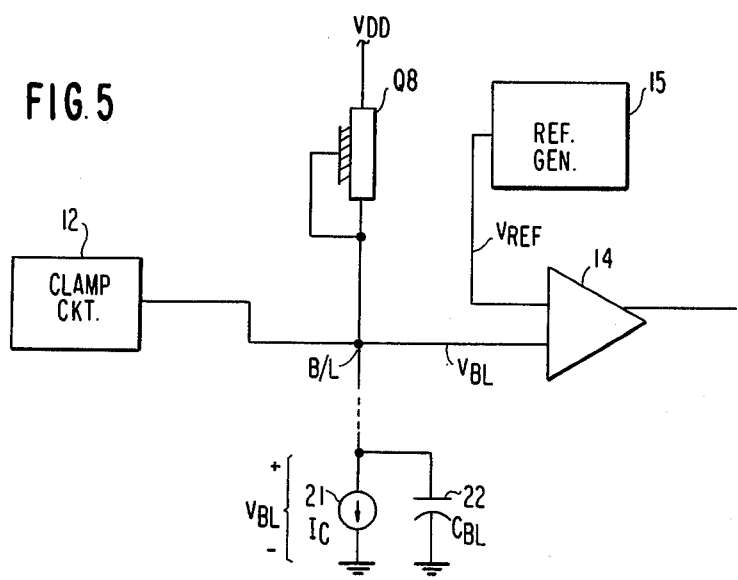
FIG. 5 is a circuit diagram of a circuit model of a bit line pull-up circuit, a voltage level comparison circuit, and a clamping circuit of the sense amplifier shown in FIG. 2.

FIG. 5 shows a circuit model of the bit line pull-up circuit 13 interconnected to the bit line B/L and the remaining circuitry and FIG. 4 is a graph showing the current-voltage characteristics of the device Q8 in which $I_8$ is the current through the device Q8 and $V_{TH8}$ is the gate threshold voltage of the device Q8.

It is assumed now that the column select switches (not shown) have been chaged in state such that a cell which had a data 0 stored therein is disconnected from the bit line B/L and a cell having a data 1 stored therein is connected thereto. This is equivalent to a data change from 0 to 1 in the single cell shown. In this case, $I_C = I_{C1}$. Since, due to predetermined device sizes, $I_{C1} > I_8$, $V_{BL}$ is pulled to ground and the capacitance 22 is discharged by a current of magnitude $I_8 - I_{C1}$. The rate at which the capacitance 22 is discharged, and hence the rate of change of $V_{BL}$, is determined by the magnitude of the discharging current $I_8 - I_{C1}$. By selecting $V_{REF}$ to by a voltage near the source or supply voltage $V_{DD}$, the discharging current is maximized.

This may be also seen from the graph of FIG. 4. At the start of discharge, the bit line voltage $V_{BL} = V_{DD}$. At this time, $I_8 = 0$, and hence, at the start of discharge of the capacitance 22, the entire current $I_{C1}$ is available to discharge the capacitance 22. As the capacitance 22 discharges, the bit line voltage $V_{BL}$ decreases. However, because the device Q8 is biased in its linear region, the current $I_8$ to the device Q8 increases before reaching its saturation value $I_8$ (max). The device Q8 is biased such that the top of the "knee" or breakpoint of the characteristic curve of the device is reached at a voltage $V_{BL} = V_{DD} - V_{TH8} = V_{REF}$. Thus, as the bit line voltage $V_{BL}$ crosses the switching point voltage $V_{REF}$, the maximum current is supplied from the device Q8 to thereby slow the discharge of the capacitance 22.

It is to be noted that further discharge of the capacitance 22 beyond the point where $V_{BL} = V_{REF}$ is of no advantage once the switching point has been crossed. Moreover, because the capacitance 22 must be recharged when a data cell containing a data 0 is connected to the bit line B/L in a subsequent data sensing operation, further discharge of the capacitance 22 would slow the operation of the device.

If the data line B/L is then disconnected from a cell containing a data 1 and connected to a cell containing a data 0, the capacitance 22 will be charged and the bit line voltage $V_{BL}$ will be driven positively, passing through the switching point voltage $V_{REF}$ while increasing toward the supply voltage $V_{DD}$. At the beginning of the charging of the capacitance 22, with $I_C = 0$, the entire current $I_8$(max) will be available for performing the charging operation. Thus, the capacitance 22 is pulled rapidly toward $V_{DD}$ passing through the reference voltage $V_{REF}$. After passing through the voltage $V_{REF}$, the operation of the device Q8 switches from the saturated mode to the linear mode. In the linear mode, as the bit line voltage $V_{BL}$ increases, the current $I_8$ decreases. Thus, the charging of the capacitance 22 is slowed after passing through the switching or reference voltage $V_{REF}$. This is advantageous in that nothing is to be gained by further charging of the capacitance 22 and further charging of the capacitance 22 would only slow the operation of the device as the capacitance 22 would require a longer time to discharge in a subsequent operation.

Referring back now to FIG. 3, the operation of the reference generator circuit 15 will now be described. From well-known principles of operation of MOS devices, it can be demonstrated that, for the connections of the devices Q3 and Q4 shown in FIG. 3:

$$I_3 = 2\lambda_3 \left( \frac{V_x}{2} - V_{TH3} \right) V_x, \text{ and}$$

$$I_4 = \lambda_4 (-V_{TH4})^2, \text{ where}$$

$$\lambda_n = \frac{\gamma_n}{2} \left( \frac{W}{L} \right)_n, \text{ for}$$

$\gamma_n$ = transconductance of device $n$, and $$\left( \frac{W}{L} \right) = \text{channel width-to-length ratio of device } n.$$

In the circuit, the device Q4 behaves as a constant current source operating in the saturation region while the device Q3 is biased in the linear region. By equating $I_3$ and $I_4$, $\lambda_4/\lambda_3$ can be calculated in terms of a circuit design equation as follows:

$$\frac{\lambda_4}{\lambda_3} = \frac{V_x^2 - 2V_{TH3}V_x}{(-V_{TH4})^2}.$$

This, for a given choice of $V_x$, the relative width-to-length ratios of Q4 and Q3 can be calculated.

As can easily be seen from FIG. 3, $V_{REF} = V_{DD} - V_x$. Therefore, the switching or reference voltage $V_{REF}$ tracks the source voltage $V_{DD}$ staying $V_x$ volts below $V_{DD}$. Thus, because the reference voltage $V_{REF}$ stays within a fixed range or margin of the source voltage $V_{DD}$, the maximum available power supply voltage is utilized for charging the discharging the capacitance 22, and hence the overall speed of the memory device is maximized.

In the manufacture of integrated circuits, the absolute value of components (for example, absolute lengths, widths, and doping densities) are difficult to control. However, it is possible to produce pairs or sets of components which have almost identical characteristics or which at least have predetermined ratios of parameters. The reference generator 15 of the invention takes advantage of this fact to ensure that, even though device parameters such as the various threshold voltages, the transconductance $\gamma$, and the width-to-length ratios W/L may vary, the relative ratios are fixed, resulting in $V_x$ tracking the magnitude of the threshold voltage $V_{TH3}$ of the device Q3 very closely. Since Q3 can be made substantially identical to Q8 with the same drain-to-source voltage at the switching point, excellent tracking is achieved to maintain the switching point at the desired value $V_{DD} - V_{TH8} = V_{REF}$, even though the supply voltage and the device parameters may vary over a relatively wide range. If $V_x$ is set to $-V_{TH3}$ (the depletion threshold is negative so that $V_x$ is positive), it can be shown that:

$$\frac{\partial V_x}{\partial V_{TH3}} = \frac{1 - 3\left( \frac{V_{TH3}}{V_{TH4}} \right)}{2} \approx -1, \text{ or } \Delta V_x \approx -\Delta V_{TH3}.$$

Since each threshold voltage $V_{TH}$ is negative, a positive value of the quantity $\Delta V_{TH3}$ indicates that the absolute value thereof is decreasing. Hence, it may be appreciated that $V_x$ tracks the magnitude of the threshold voltage $V_{TH3}$.

Next, the clamp circuit 12 will be discussed. The devices Q11 and Q12 are substantially identical to the devices Q3 and Q4, respectively. Thus, the voltage $V_L$ across the device Q12 tracks the supply voltage $V_{DD}$ in the same manner as the circuit of the device as Q3 and Q4, and hence the voltage $V_L$ is maintained essentially a threshold voltage below $V_{DD}$.

This voltage is applied to the gate of the enhancement mode device Q7. When the bit line voltage $V_{BL}$ goes a threshold voltage level below $V_L$, the device Q7 will turn on. The device Q7 is fabricated with a relatively high W/L ratio compared with that of the data cell to enable the device Q7 to clamp the bit line voltage $V_{BL}$ at this level. Because the voltage $V_L$ tracks the power source voltage $V_{DD}$, the clamping level, and hence the voltage window around the switching point voltage $V_{REF}$, track the variations in the power source voltage. Without this type of tracking, the switching point voltage and the window levels would have to be set for worse case power supply variations. This would lead to wider voltage excursions on the bit line B/L, thereby lowering the overall speed of the memory.

Next, the operation of the comparator circuit 14 and the output buffer/level shifter circuit 16 will be explained. As can be readily be appreciated from FIG. 3, the devices Q1, Q2, Q5 and Q6 of the comparison circuit 14 are connected in a differential amplifier configuration. As discussed earlier, the devices Q3 and Q4 of the reference voltage generator 15 provide a reference voltage $V_{REF}$ which closely tracks the power source voltage $V_{DD}$. Utilizing the reference voltage $V_{REF}$, the devices Q1 and Q2 establish a voltage $V_Y$ which has little variation with fluctuations in $V_{DD}$ and which tracks the threshold voltage variations of the enhancement devices. This can be demonstrated mathematically as follows.

The currents $I_1$ and $I_2$ through the devices Q1 and Q2, respectively, may be written as:

$$I_1 = \lambda_1(V_y - V_{TH1})^2 \text{ and}$$

$$I_2 = \lambda_2(V_{REF} - V_y - V_{TH2})^2,$$

where $V_{TH1}$ and $V_{TH2}$ are the threshold voltages of the devices Q1 and Q2, respectively. Setting $I_1 = I_2$:

$$(\lambda_1/\lambda_2)^{\frac{1}{2}}(V_y - V_{TH1}) = V_{REF} - V_y - V_{TH2}, \text{ or}$$

$$G(V_y - V_{TH1}) = V_{REF} - V_y - V_{TH2},$$

where $G = (\lambda_1/\lambda_2)^{\frac{1}{2}}$. Then, $V_y$ can be computed as:

$$V_y = \frac{GV_{TH1} + V_{REF} - V_{TH2}}{1 + G}, \text{ and hence}$$

$$\frac{\partial V_y}{\partial V_{REF}} = \frac{1}{1+G}, \frac{\partial V_y}{\partial V_{TH2}} = -\frac{1}{1+G}, \text{ and}$$

$$\frac{\partial V_y}{\partial V_{TH1}} = \frac{G}{1+G}.$$

Because $G >> 1$, $\frac{1}{1+G} << 1$ and $\frac{G}{1+G} \approx 1$.

Hence, it can be seen that $V_y$ is substantially insensitive to variations in $V_{REF}$, $V_{DD}$ and $V_{TH2}$ but tracks the enhancement threshold $V_{TH1}$.

The devices Q2 and Q5 and the devices Q1 and Q6 are to be made identical. Thus, when $V_{BL}$ is precisely at the switching reference voltage $V_{REF}$, the comparison circuit 14 is balanced and $V_Z = V_y$. When the amplifier composed of the devices Q9 and Q10 is balanced, it is operating in its linear region. This is an optimum bias point so as to produce a maximum switching or operating speed. Since the devices Q1, Q6 and Q10 are all enhancement devices with the same source-substrate voltages, their threshold voltage variations will track closely and the balanced condition will be maintained even with process variations.

This completes the description of the preferred embodiments of the invention. Although preferred embodiments have been described, it is believed that numerous modifications and alterations thereto would be apparent to one having ordinary skill in the art without departing from the spirit and scope of the invention.

I claim:

1. A sense amplifier circuit comprising: means for generating a variable reference voltage that tracks a variable power supply voltage by a first predetermined voltage difference from said power supply voltage;
   differential amplifier means having a first input coupled to a memory cell line and a second input coupled to receive said reference voltage; and
   voltage clamping circuit means coupled to said memory cell line for restricting negative voltage excursions on said memory cell line to lie within a second predetermined voltage difference below said reference voltage.

2. The sense amplifier of claim 1 wherein said reference voltage is substantially closer to said power supply voltage than to a ground level.

3. The sense amplifier circuit of claim 2 further comprising pull-up circuit means for pulling said memory cell line toward said power supply voltage.

4. The sense amplifier circuit of claim 3 wherein said pull-up circuit means is biased to operate in a linear mode for voltages applied thereto from said memory cell line between said power supply voltage and said reference voltage and to operate in a saturation mode for voltages supplied thereto from said memory cell line below said reference voltage.

5. The sense amplifier of claim 2 wherein said voltage clamping circuit means comprises means for maintaining said second predetermined voltage difference at a fixed value with respect to said reference voltage.

6. The sense amplifier circuit of any one of claims 1–5 further comprising output level shifting circuit means for shifting in range a voltage outputted by said differential amplifier means.

7. The sense amplifier of any one of claims 1–5 wherein said reference voltage generating means comprises depletion mode first and second FETs having channels connected in series between a terminal receiving said power supply voltage and ground with a gate and one of a source and drain of said first FET being connected to said terminal and a gate and the other of said source and drain of said second FET being connected to ground, said reference voltage being produced at a common connection point between said first and second FETs.

8. The sense amplifier of any one of claims 1–5 wherein said voltage clamping circuit means comprises depletion mode first and second FETs having channels connected in series between a terminal receiving said power supply voltage and ground with a gate and one of a source and drain of said first FET being connected to said terminal and a gate and the other of said source and drain of said second FET being connected to ground, and an enhancement mode third FET having a gate connected to a common connection point between said first and second FETs and said one of said source and drain connected to said terminal, said other one of said source and drain of said third FET being connected to said memory cell line.

9. A bit line sense amplifier for a semiconductor memory comprising:
   a depletion mode first FET having a gate and drain connected to a source of a positive supply voltage terminal;
   a depletion mode second FET having a gate and source connected to ground and a drain connected to a source of said first FET;
   an enhancement mode third FET having a drain connected to said positive terminal, a gate connected to said source of said first FET and a source connected to a bit line;

a depletion mode fourth FET having a drain connected to said positive terminal and a gate a source connected to said bit line;
a depletion mode fifth FET having a drain connected to said positive terminal and a gate connected to said bit line;
a depletion mode sixth FET having a drain connected to said positive terminal;
an enhancement mode seventh FET having a drain connected to a source of said fifth FET and a source connected to ground;
an enhancement mode eighth FET having a gate and drain connected to a source of said sixth FET and to a gate of said seventh FET, and a source connected to ground;
a depletion mode ninth FET having a drain and gate connected to said positive terminal and a source connected to a gate of said sixth FET;
a depletion mode tenth FET havin a drain connected to said source of said ninth FET and a gate and source connected ground;
a depletion mode eleventh FET having a drain connected to said positive terminal; and
an enhancement mode twelfth FET having a drain connected to a source and gate of said eleventh FET, a gate connected to said drain of said seventh FET, and a source connected to ground, an output signal being produced on said drain of said twelfth FET.

10. The sense amplifier of claim 9 wherein said first and ninth FETs are of the same type and structure and said second and tenth FETs are of the same type and structure.

11. The sense amplifier of claim 9 wherein said fifth and sixth FETs are of the same type and structure and said seventh and eighth FETs are of the same type and structure.

12. The sense amplifier of claim 9 wherein said third FET has a substantially greater current driving capability than a data cell connected to said bit line.

13. The sense amplifier of claim 9 wherein said fourth FET has a threshold voltage such that a breakpoint between a saturation mode and a linear mode of said fourth FET on a current-voltage characteristic curve representative of said fourth FET is at a point on said curve such that a difference between said power supply voltage on said positive terminal and the magnitude of said threshold voltage of said fourth FET is substantially equal to a reference voltage on said gate of said sixth FET.

* * * * *